(12) United States Patent
Kobayashi

(10) Patent No.: US 11,762,298 B2
(45) Date of Patent: Sep. 19, 2023

(54) EXPOSURE APPARATUS AND METHOD OF MANUFACTURING ARTICLE

(71) Applicant: CANON KABUSHIKI KAISHA, Tokyo (JP)

(72) Inventor: Daisuke Kobayashi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/673,854

(22) Filed: Feb. 17, 2022

(65) Prior Publication Data

US 2022/0171291 A1   Jun. 2, 2022

Related U.S. Application Data

(63) Continuation of application No. PCT/JP2020/028195, filed on Jul. 21, 2020.

(30) Foreign Application Priority Data

Sep. 3, 2019   (JP) .................................. 2019-160664

(51) Int. Cl.
   *G03F 7/20*       (2006.01)
   *G03F 7/00*       (2006.01)

(52) U.S. Cl.
   CPC .................................. *G03F 7/7015* (2013.01)

(58) Field of Classification Search
   CPC ............... G03F 7/7015; G03F 7/70075; G03F 7/70141; G03F 7/70066; G03F 7/20;
   (Continued)

(56) References Cited

U.S. PATENT DOCUMENTS

| 9,880,474 B2 * | 1/2018 | Patra .................... G03F 7/70191 |
| 11,165,978 B2 | 11/2021 | Kobuse et al. |
| 2011/0267595 A1 * | 11/2011 | Mori .................... G03F 7/70066 |
| | | 355/77 |

FOREIGN PATENT DOCUMENTS

| JP | 2000-315648 A | 11/2000 |
| JP | 2002-033272 A | 1/2002 |

(Continued)

OTHER PUBLICATIONS

International Search Report issued by the Japan Patent Office dated Oct. 13, 2020 in corresponding International Application No. PCT/JP2020/028195, with English translation.

(Continued)

*Primary Examiner* — Mesfin T Asfaw
(74) *Attorney, Agent, or Firm* — Carter, DeLuca & Farrell LLP

(57) ABSTRACT

There is provided an exposure apparatus including a first light shielding unit including a first light shielding member and a second light shielding member, which include end potions facing each other in a scanning direction and in which a relative distance therebetween in the scanning direction can be changed, and arranged at a position away from a conjugate plane of a surface to be illuminated to a side of a light source, and a second light shielding unit including a third light shielding member and a fourth light shielding member, which include end portions facing each other in the scanning direction and in which a relative distance therebetween in the scanning direction can be changed, and arranged at a position away from the conjugate plane to a side of the surface.

18 Claims, 6 Drawing Sheets

(58) Field of Classification Search
CPC ............. G03F 7/70191; G03F 7/70358; G03F 7/70091; G03F 7/70558
See application file for complete search history.

(56) References Cited

FOREIGN PATENT DOCUMENTS

| | | |
|---|---|---|
| JP | 2002-110529 A | 4/2002 |
| JP | 2005-109304 A | 4/2005 |
| JP | 2006-253186 A | 9/2006 |
| JP | 2008-153401 A | 7/2008 |
| JP | 2009-059893 A | 3/2009 |
| JP | 2010-073835 A | 4/2010 |
| JP | 2014-116406 A | 6/2014 |
| TW | 201909241 A | 3/2019 |
| WO | 2011/010560 A1 | 1/2011 |

OTHER PUBLICATIONS

TW Office Action issued in corresponding TW Patent Application No. 109125491, dated Nov. 15, 2022, pp. 1-9.

\* cited by examiner

EXPOSURE APPARATUS AND METHOD OF MANUFACTURING ARTICLE

CROSS-REFERENCE TO RELATED APPLICATIONS

This application is a Continuation of International Patent Application No. PCT/JP2020/028195, filed Jul. 21, 2020, which claims the benefit of Japanese Patent Application No. 2019-160664, filed Sep. 3, 2019, both of which are hereby incorporated by reference herein in their entirety.

BACKGROUND OF THE INVENTION

Field of the Invention

The present invention relates to an exposure apparatus and a method of manufacturing an article.

Background Art

An exposure apparatus that illuminates an original (a reticle or a mask) by an illumination optical system and projects a pattern of the original onto a substrate (wafer) via a projection optical system has been conventionally used. The exposure apparatus is increasingly requested to improve the resolution and throughput. For example, in order to implement an improvement of the resolution, it is effective to shorten the wavelength of the exposure light and increase the NA (Numerical Aperture) (rise the NA) of the projection optical system. Illuminating the original by modified illumination (annular illumination, dipole illumination, quadrupole illumination, or the like) is also effective to improve the resolution. It is known to use a diffraction optical element in the illumination optical system to form the modified illumination.

PTL 1 discloses an exposure apparatus including a light shielding unit arranged at a position defocused to the side of the light source of the conjugate plane of the surface to be illuminated of the exposure apparatus, and a light shielding unit arranged at a position defocused to the side of the surface to be illuminated of the conjugate plane of the surface to be illuminated. In the exposure apparatus disclosed in PTL 1, the centroid light beam of a light flux illuminating each point in the scanning direction can be made almost parallel to the optical axis.

CITATION LIST

Patent Literature

PTL 1: Japanese Patent Laid-Open No. 2010-73835

However, when projecting the pattern of the original (on the object plane) arranged on the surface to be illuminated onto the substrate (on the image plane) via the projection optical system, if the centroid light beam of the effective light source distribution (light intensity distribution) on the surface to be illuminated is shifted, the telecentric degree on the image plane decreases. Therefore, if the focus is deviated at the time of exposure, the overlay accuracy in the exposure apparatus decreases. Accordingly, it is necessary to appropriately set the shift of the centroid light beam of the effective light source distribution on the surface to be illuminated.

The present invention provides an exposure apparatus advantageous in suppressing a shift of the centroid light beam of a light intensity distribution on a surface to be illuminated and a decrease in telecentric degree.

SUMMARY OF THE INVENTION

In order to achieve the above-described object, an exposure apparatus as an aspect of the present invention is an exposure apparatus that exposes a substrate while moving an original and the substrate, characterized by comprising an illumination optical system configured to illuminate a surface to be illuminated of the original with light from a light source, wherein the illumination optical system comprises a first light shielding unit including a first light shielding member and a second light shielding member, which include end potions facing each other in a scanning direction and in which a relative distance therebetween in the scanning direction can be changed, and arranged at a position away from a conjugate plane of the surface to be illuminated to a side of the light source, and a second light shielding unit including a third light shielding member and a fourth light shielding member, which include end portions facing each other in the scanning direction and in which a relative distance therebetween in the scanning direction can be changed, and arranged at a position away from the conjugate plane to a side of the surface to be illuminated, and the first light shielding unit and the second light shielding unit are arranged such that, at a predetermined position in a direction orthogonal to the scanning direction in a plane of the conjugate plane, a first distance between a midpoint between the end portion of the first light shielding member and the end portion of the second light shielding member facing each other and a surface including an optical axis of the illumination optical system and orthogonal to the scanning direction matches a second distance between a midpoint between the end portion of the third light shielding member and the end portion of the fourth light shielding member facing each other and the plane.

Further features of the present invention will become apparent from the following description of exemplary embodiments with reference to the attached drawings.

DESCRIPTION OF THE EMBODIMENTS

Figure 1:
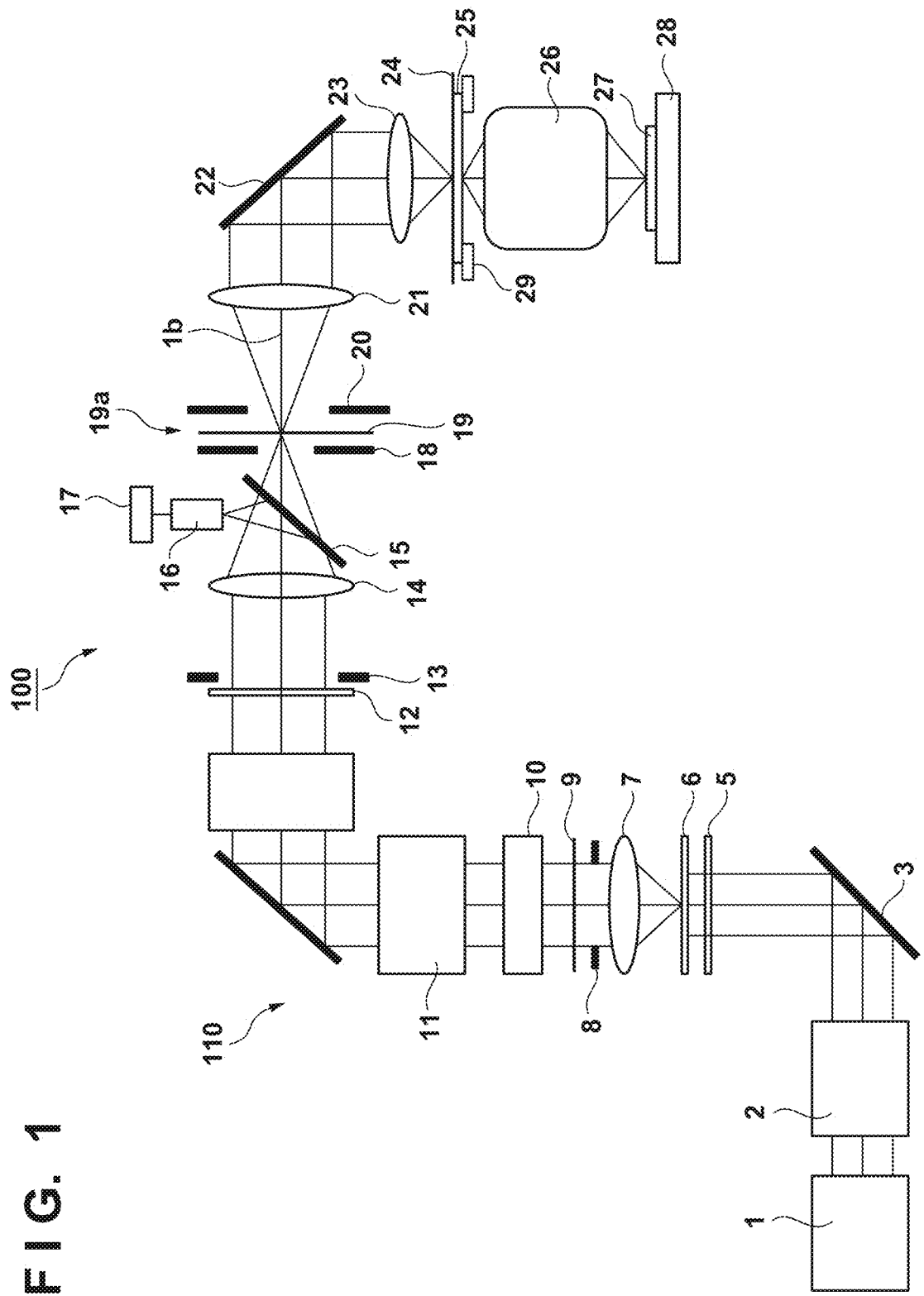
FIG. 1 is a schematic sectional view showing the arrangement of an exposure apparatus as an aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a schematic sectional view showing the arrangement of an exposure apparatus 100 as an aspect of the present invention. The exposure apparatus 100 is a step-and-scan exposure apparatus (scanner) that exposes (scans and exposes) a substrate 27 while moving an original 25 and the substrate 27 in a scanning direction to transfer the pattern of the original 25 onto the substrate. The exposure apparatus 100 includes an illumination optical system 110 that illuminates the original 25 (a reticle or a mask) with light from a light source 1 and a projection optical system 26 that projects the pattern of original 25 onto the substrate 27 (a wafer, a glass plate, or the like).

The light source 1 includes a mercury lamp having a wavelength of approximately 365 nm and excimer lasers such as a KrF excimer laser having a wavelength of approximately 248 nm, an ArF excimer laser having a wavelength of approximately 193 nm, and the like, and emits a light flux (exposure light) for illuminating the original 25.

The illumination optical system 110 includes a relay optical system 2, an exit angle storing optical element 5, a diffraction optical element 6, a condenser lens 7, a light shielding member 8, a prism unit 10, and a zoom lens unit 11. The illumination optical system 110 also includes an optical integrator 12, a stop 13, a condenser lens 14, a first light shielding unit 18, a second light shielding unit 20, a masking unit 19, a condenser lens 21, and a collimator lens 23.

The relay optical system 2 is arranged between the light source 1 and the exit angle storing optical element 5 to guide the light flux from the light source 1 to the exit angle storing optical element 5. The exit angle storing optical element 5 is arranged on the light source side of the diffraction optical element 6, and guides the light flux from the light source 1 to the diffraction optical element 6 while maintaining a constant angle of divergence. The exit angle storing optical element 5 includes an optical integrator such as a fly-eye lens, a microlens array, a fiber bundle, or the like. The exit angle storing optical element 5 reduces the influence from a change in the output of the light source 1 on a light intensity distribution (pattern distribution) formed by the diffraction optical element 6.

The diffraction optical element 6 is arranged on a plane that has a Fourier transform relationship with the pupil plane of the illumination optical system 110. The diffraction optical element 6 forms, on the pupil plane of the illumination optical system 110 which is a plane conjugate to the pupil plane of the projection optical system 26 and a plane conjugate to the pupil plane of the illumination optical system 110, a desired light intensity distribution by converting the light intensity distribution of the light flux from the light source 1 by a diffraction effect. The diffraction optical element 6 may be formed by a CGH (Computer Generated Hologram) that has been designed by a computer so that a desired diffraction pattern can be obtained on a diffraction pattern plane. In this embodiment, the light source shape formed on the pupil plane of the projection optical system 26 will be referred to as an effective light source shape. Note that an "effective light source" means the light intensity distribution or the light angle distribution on a surface to be illuminated and a conjugate plane of the surface to be illuminated. The diffraction optical element 6 is arranged between the exit angle storing optical element 5 and the condenser lens 7.

A plurality of diffraction optical elements 6 may be arranged in the illumination optical system 110. For example, each of the plurality of diffraction optical elements 6 is attached to (mounted onto) a corresponding one of a plurality of slots of a turret (not shown). The plurality of diffraction optical elements 6 form different effective light source shapes. These effective light source shapes include a small circular shape (comparatively small circular shape), a large circular shape (comparatively large circular shape), an annular shape, a dipole shape, a quadrupole shape, and other shapes. A method that illuminates a surface to be illuminated by an effective light source shape having an annular shape, a dipole shape, or a quadrupole shape is referred to as modified illumination.

The light flux from the exit angle storing optical element 5 is diffracted by the diffraction optical element 6 and is guided to the condenser lens 7. The condenser lens 7 is arranged between the diffraction optical element 6 and the prism unit 10, condenses the light fluxes diffracted by the diffraction optical element 6, and forms a diffraction pattern (light intensity distribution) on a Fourier transform plane 9.

The Fourier transform plane 9 is formed between the optical integrator 12 and the diffraction optical element 6 and is a plane which has an optical Fourier transform relationship with the diffraction optical element 6. The shape of the diffraction pattern formed on the Fourier transform plane 9 can be changed by changing the diffraction optical element 6 to be arranged on the optical path of the illumination optical system 110.

The light shielding member 8 is arranged to be movable in a direction perpendicular to an optical axis 1b of the illumination optical system 110, and is arranged on the upstream side (light source side) of the Fourier transform plane 9. The light shielding member 8 is arranged at a position slightly defocused from the position of the Fourier transform plane 9.

The prism unit 10 and the zoom lens unit 11 are arranged between the Fourier transform plane 9 and the optical integrator 12 and function as a zoom optical system that expands the light intensity distribution formed on the Fourier transform plane 9. The prism unit 10 adjusts the annular ratio or the like of the light intensity distribution formed on the Fourier transform plane 9 and guides the adjusted light intensity distribution to the zoom lens unit 11. Also, the zoom lens unit 11 is arranged between the prism unit 10 and the optical integrator 12. The zoom lens unit 11 includes, for example, a plurality of zoom lenses, and adjusts the σ value of the diffraction pattern which is based on the ratio between the NA of the illumination optical system 110 and the NA of the projection optical system 26 to guide the light intensity distribution formed on the Fourier transform plane 9 to the optical integrator 12.

The optical integrator 12 is arranged between the zoom lens unit 11 and the condenser lens 14. The optical integrator 12 includes a fly-eye lens that forms multiple secondary light sources in accordance with the light intensity distribution whose annular ratio, aperture angle, and σ value have been adjusted and guides the multiple secondary light sources to the condenser lens 14. However, the optical integrator 12 may include another optical element such as an optical pipe, a diffraction optical element, a microlens array, or the like instead of the fly-eye lens. The optical integrator 12 uniformly illuminates the original 25 arranged on a surface 24 to be illuminated with the light flux that has passed through the diffraction optical element 6. The stop 13 is arranged between the optical integrator 12 and the condenser lens 14.

The condenser lens 14 is arranged between the optical integrator 12 and the original 25. As a result, the multiple light fluxes guided from the optical integrator 12 can be condensed and the original 25 can be illuminated with the condensed multiple light fluxes in a superimposed manner. After the light beams enter the optical integrator 12 and are condensed by the condenser lens 14, a conjugate plane 19a which is the focal plane of the condenser lens 14 is illuminated by a substantially rectangular shaped light beam.

A half-mirror 15 is arranged on a stage subsequent to the condenser lens 14. A part of the exposure light reflected by the half-mirror 15 enters a light amount measurement optical system 16. A sensor 17 which measures the light amount is arranged on a stage subsequent to the light amount measurement optical system 16. The exposure amount at the time of exposure is appropriately controlled based on the light amount measured by the sensor 17.

The masking unit 19 is arranged on the conjugate plane 19a, which is a plane conjugate to the surface 24 to be illuminated, or near the conjugate plane 19a, and illuminated by a substantially rectangular shaped light intensity distribution. The masking unit 19 is arranged to delimit the illumination range of the original 25, and is scanned in synchronization with an original stage 29 and a substrate stage 28. In scanning exposure, from a state in which the aperture defined by two masking blades facing each other is closed, the masking unit 19 moves one masking blade to gradually widen the aperture. When moving of the one masking blade ends, the other masking blade is moved to gradually narrow the aperture. The details of such an operation of the masking unit 19 at the time of scanning exposure is disclosed in, for example, Japanese Patent Laid-Open No. 2005-109304. The original stage 29 is a stage that holds and moves the original 25, and the substrate stage 28 is a stage that holds and moves the substrate 27.

Two light shielding units, which are the first light shielding unit 18 and the second light shielding unit 20 in this embodiment, are arranged at positions away (defocused) from the masking unit 19 (the conjugate plane 19a of the surface 24 to be illuminated). The first light shielding unit 18 is arranged at the position away from the conjugate plane 19a of the surface 24 to be illuminated to the side of the light source. The second light shielding unit 20 is arranged at the position away from the conjugate plane 19a of the surface 24 to be illuminated to the side of the surface to be illuminated.

Light reflected by a mirror 22 that has a predetermined tilt with respect to the light flux from the condenser lens 21 illuminates the original 25 via the collimator lens 23.

The projection optical system 26 projects the pattern of the original 25 onto the substrate 27. The resolution of the pattern of the original 25 depends on the effective light source shape. Hence, the resolution of the pattern of the original 25 can be improved by forming the appropriate effective light source shape in the illumination optical system 110.

Figure 2:
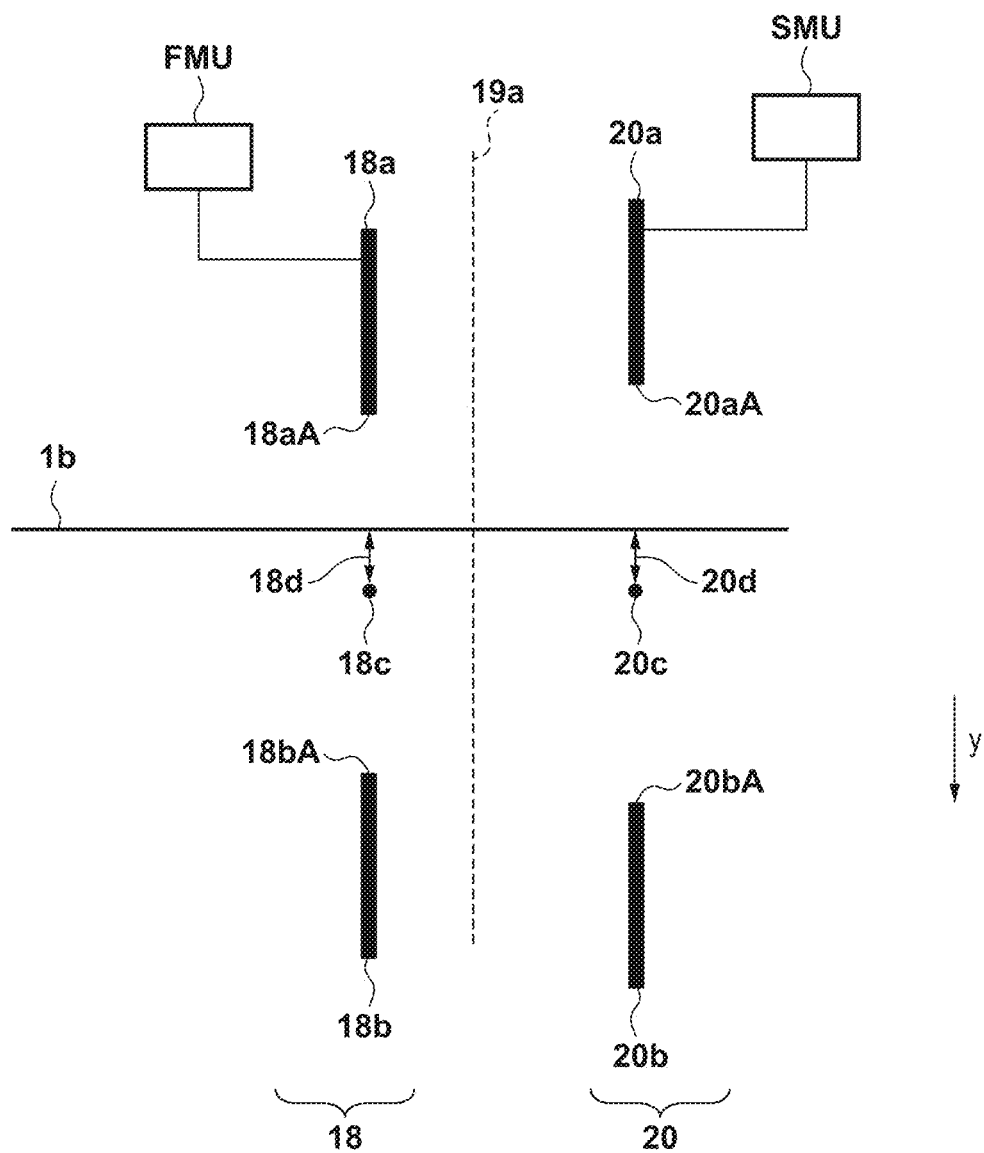
FIG. 2 is a view for explaining the details of a first light shielding unit and a second light shielding unit.

With reference to FIG. 2, the details of the first light shielding unit 18 and the second light shielding unit 20 will be described. In FIG. 2, the y direction indicates the scanning direction. Here, the "scanning direction" includes the scanning direction of the original 25 and the substrate 27 and the scanning direction of the masking blades of the masking unit 19 to be scanned in synchronization with the original 25 and the substrate 27. Hence, in this embodiment, the masking blades of the masking unit 19 are scanned in the same direction as the original 25 and the substrate 27. Note that although FIG. 1 shows that the original 25 and the substrate 27 are scanned in the direction orthogonal to the scanning direction of the masking blades of the masking unit 19, this is because the mirror 22 is arranged, and they are scanned in the same direction in the apparatus coordinate system.

The first light shielding unit 18 includes a first light shielding member 18a and a second light shielding member 18b, which include end portions facing each other in the scanning direction and in which the relative distance therebetween in the scanning direction can be changed. An end portion 18aA of the first light shielding member 18a and an end portion 18bA of the second light shielding member 18b are located in the light beam effective region and adjust, by shielding a part of the light beam, the intensity of light reaching the surface 24 to be illuminated. In this embodiment, a first moving unit FMU that moves at least one of the first light shielding member 18a and the second light shielding member 18b along the scanning direction is arranged in the first light shielding unit 18. More specifically, the first moving unit FMU includes an actuator connected to the first light shielding member 18a (that is, moves the first light shielding member 18a along the scanning direction). The first moving unit FMU moves the first light shielding member 18a along the scanning direction, thereby changing the aperture width defined by the end portion 18aA of the first light shielding member 18a on the side of the second light shielding member and the end portion 18bA of the second light shielding member 18b on the side of the first light shielding member. In this embodiment, since the first moving unit FMU can change the position of the first light shielding member 18a, a midpoint 18c between the end portion 18aA of the first light shielding member 18a and the end portion 18bA of the second light shielding member 18b does not always match the optical axis 1b of the illumination optical system 110. In other words, in this embodiment, the midpoint 18c between the end portion 18aA of the first light shielding member 18a and the end portion 18bA of the second light shielding member 18b exists at a position away from a plane including the optical axis 1b of the illumination optical system 110 and orthogonal to the scanning direction (a first distance 18d is not zero).

The second light shielding unit 20 includes a third light shielding member 20a and a fourth light shielding member 20b, which include end portions facing each other in the scanning direction and in which the relative distance therebetween in the scanning direction can be changed. An end portion 20aA of the third light shielding member 20a and an end portion 20bA of the fourth light shielding member 20b are located in the light beam effective region and adjust, by shielding a part of the light beam, the intensity of light reaching the surface 24 to be illuminated. In this embodiment, a second moving unit SMU that moves at least one of the third light shielding member 20a and the fourth light shielding member 20b along the scanning direction is arranged in the second light shielding unit 20. More specifically, the second moving unit SMU includes an actuator connected to the third light shielding member 20a (that is, moves the third light shielding member 20a along the scanning direction). The second moving unit SMU moves the third light shielding member 20a along the scanning direction, thereby changing the aperture width defined by the end portion 20aA of the third light shielding member 20a on the side of the fourth light shielding member and the end portion 20bA of the fourth light shielding member 20b on the side of the third light shielding member. In this embodiment, since the second moving unit SMU can change the position of the third light shielding member 20a, a midpoint 20c between the end portion 20aA of the third light shielding member 20a and the end portion 20bA of the fourth light shielding member 20b does not always match the optical axis 1b of the illumination optical system 110. In other words, in this embodiment, the midpoint 20c between the end portion 20aA of the third light shielding member 20a and the end portion 20bA of the third light shielding member 20b exists at a position away from the plane including the optical axis 1b of the illumination optical system 110 and orthogonal to the scanning direction (a second distance 20d is not zero).

In this embodiment, one (first light shielding member 18a) of the first light shielding member 18a and the second light shielding member 18b can be moved, and the position of the other one (second light shielding member 18b) is fixed. Similarly, one (third light shielding member 20a) of the third light shielding member 20a and the fourth light shielding member 20b can be moved, and the position of the other one (fourth light shielding member 20b) is fixed. As will be described later, in order to uniformize the illuminance distribution (correct the illuminance unevenness) at the time of scanning exposure, it is necessary to change the aperture widths defined by the first light shielding unit 18 and the second light shielding unit 20 at respective positions in the direction orthogonal to the scanning direction in the plane of the conjugate plane 19a. However, since it is only required to uniformize the illuminance distribution obtained by integration in the scanning direction, it is unnecessary to move both the first light shielding member 18a and the second light shielding member 18b and both the third light shielding member 20a and the fourth light shielding member 20b. As in this embodiment, when one of the first light shielding member 18a and the second light shielding member 18b and one of the third light shielding member 20a and the fourth light shielding member 20b are configured to be movable, an increase in size of the mechanism that moves them can be prevented. This is advantageous in terms of the arrangement space. Note that if there is a margin in the arrangement space, another moving unit may be provided for each of the second light shielding member 18b and the fourth light shielding member 20b to move the second light shielding member 18b and the fourth light shielding member 20b in the scanning direction.

As shown in FIG. 2, the distance from the conjugate plane 19a of the surface 24 to be illuminated to the first light shielding unit 18 may be different from the distance from the conjugate plane 19a to the second light shielding unit 20. Note that if the distance from the conjugate plane 19a of the surface 24 to be illuminated (masking unit 19) to each of the first light shielding unit 18 and the second light shielding unit 20 is too small, periodic striped illuminance unevenness occurs at the time of scanning exposure. On the other hand, if the distance from the conjugate plane 19a of the surface 24 to be illuminated to each of the first light shielding unit 18 and the second light shielding unit 20 is too large, the width of the distribution on the masking blades increases even with the same aperture width. Accordingly, the effective diameter of the optical system needs to be increased. Thus, there is an optimal distance for the distance between the conjugate plane 19a of the surface 24 to be illuminated and each of the first light shielding unit 18 and the second light shielding unit 20. In this embodiment, in accordance with various conditions, the first light shielding unit 18 and the second light shielding unit 20 are arranged so as to set the distance between the conjugate plane 19a of the surface 24 to be illuminated and each of the first light shielding unit 18 and the second light shielding unit 20 to the optimal distance.

Figure 3:
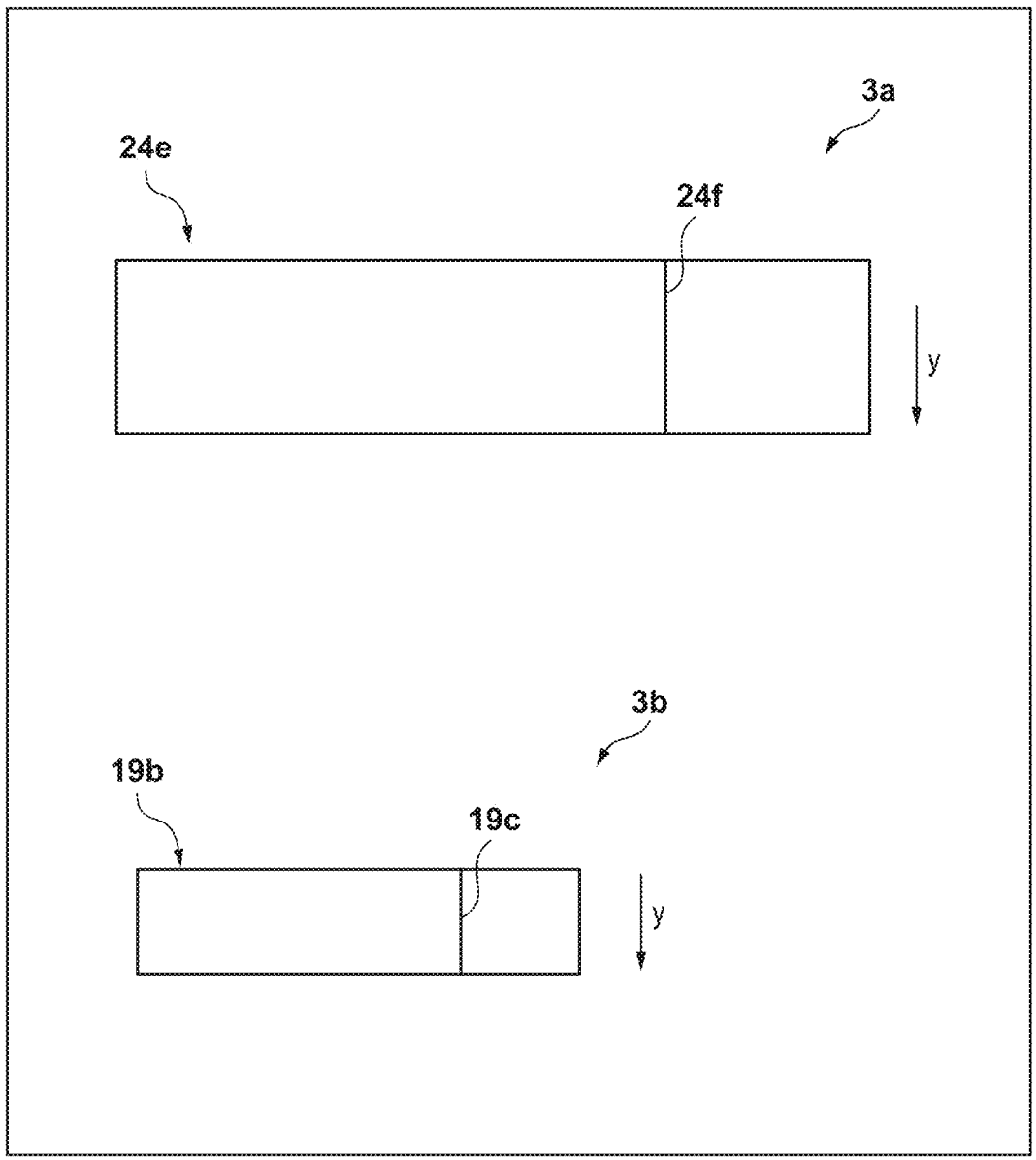
FIG. 3 is a view for explaining the integrated effective light source.

With reference to FIGS. 3a and 3b, the integrated effective light source will be described. In FIGS. 3a and 3b, the y direction indicates the scanning direction. FIG. 3a shows an illumination region 24e of the surface 24 to be illuminated, and FIG. 3b shows an illumination region 19b of the conjugate plane 19a (masking unit 19) which has a conjugate relationship with the surface 24 to be illuminated.

In exposure, the illumination region 24e is scanned. At this time, the incident angle distribution illuminating a given point on the exposure surface is obtained by integrating the incident angle distributions illuminating respective points of a straight line 24f parallel to the scanning direction (y direction) in the illumination region 24e, and this will be referred to as the integrated effective light source. A straight line 19c is a set of points conjugate to the respective points of the straight line 24e on the conjugate plane 19a, so that the integrated effective light source is equivalent to the incident angle distribution obtained by integrating the incident angle distributions illuminating the surface 24 to be illuminated by the light fluxes passing through respective points of the straight line 19c.

Figure 4:
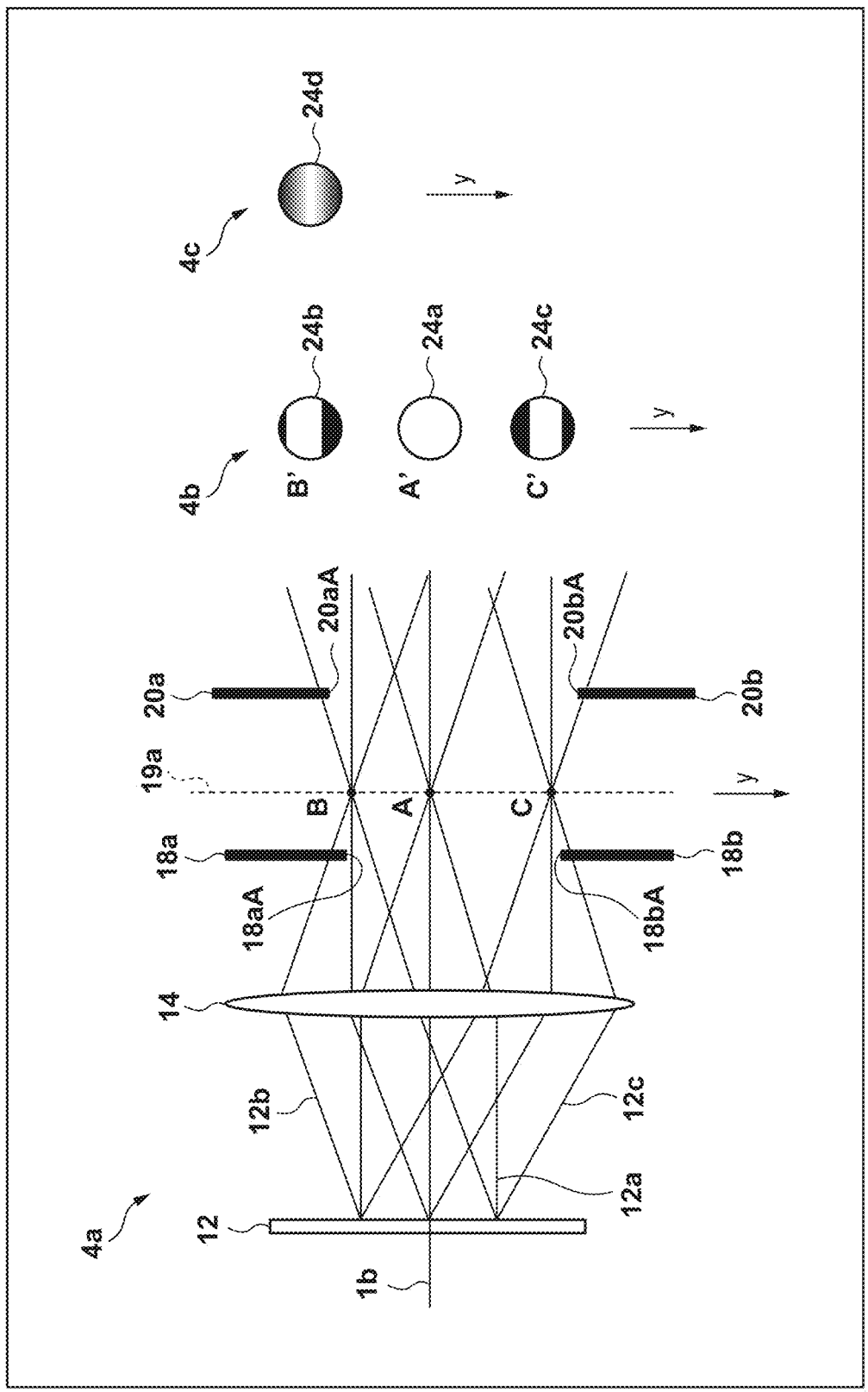
FIG. 4 is a view for explaining the functions of the first light shielding unit and the second light shielding unit.

With reference to FIGS. 4a, 4b, and 4c, the functions of the first light shielding unit 18 and the second light shielding unit 20 will be described. In FIGS. 4a, 4b, and 4c, the y direction indicates the scanning direction. FIG. 4a is an enlarged view showing the vicinity of the optical integrator 12, the condenser lens 14, the first light shielding unit 18, and the second light shielding unit 20. FIG. 4a shows light beams emitted from the optical integrator 12 and passing through points A, B, and C in the conjugate plane 19a via the condenser lens 14. Here, the points A, B, and C are points on the straight line 19c shown in FIG. 3b. FIG. 4b is a view showing effective light sources 24a, 24b, and 24c at points A', B', and C', respectively, of the surface 24 to be illuminated. The points A', B', and C' are in the conjugate relationship with the points A, B, and C in the conjugate plane 19a of the surface 24 to be illuminated, respectively. FIG. 4c is a view showing an integrated effective light source 24d obtained by integrating all the light beams passing on the straight line including the points A', B', and C' of the surface 24 to be illuminated.

For easy understanding of the present invention, a case in which the effective light source has a circular shape, which is called conventional illumination, will be taken as an example and described in this embodiment, but the effective light source has an annular shape, a multipole shape, or the like depending on a combination of the prism unit 10 and the diffraction optical element 6. The present invention is not limited by the shape of the effective light source formed by the diffraction optical element 6, the prism unit 10, and the like.

Referring to FIG. 4a, a light beam 12a emitted from the optical integrator 12 in parallel to the optical axis 1b and traveling toward the point A in the conjugate plane 19a via the condenser lens 14 is not shielded by the first light shielding unit 18 and the second light shielding unit 20. Therefore, the effective light source 24a at the point A' in the surface 24 to be illuminated is substantially circular, and substantially symmetrical in the scanning direction as shown in FIG. 4b.

On the other hand, a light beam 12b emitted from the optical integrator 12 while being tilted to the first light shielding member side with respect to the optical axis 1b and traveling toward the point B in the conjugate plane 19a via the condenser lens 14 is partially shielded by the first light shielding member 18a and the third light shielding member 20a. Therefore, the effective light source 24b at the point B' in the surface 24 to be illuminated has a circular shape which is partially lost. Further, since the amount of light shielded by the first light shielding member 18a is different from the amount of light shielded by the third light shielding member 20a, the effective light source 24b at the point B' in the surface 24 to be illuminated generally has an asymmetric shape in the scanning direction.

Further, a light beam 12c emitted from the optical integrator 12 while being tilted to the second light shielding member side with respect to the optical axis 1b and traveling toward the point C in the conjugate plane 19a via the condenser lens 14 is partially shielded by the second light shielding member 18b and the fourth light shielding member 20b. Therefore, the effective light source 24c at the point C' in the surface 24 to be illuminated has a circular shape which is partially lost. Further, since the amount of light shielded by the second light shielding member 18b is different from the amount of light shielded by the fourth light shielding member 20b, the effective light source 24c at the point C' in the surface 24 to be illuminated generally has an asymmetric shape in the scanning direction.

In this embodiment, the exit angle of the light beam 12c is determined such that the light amount of the light flux traveling from the condenser lens 14 toward the point C and shielded by the second light shielding member 18b matches the light amount of the light flux traveling from the condenser lens 14 toward the point B and shielded by the first light shielding unit 18a. At this time, the position of the fourth light shielding member 20b is determined such that the light amount of the light flux traveling from the condenser lens 14 toward the point C and shielded by the fourth light shielding member 20b matches the light amount of the light flux traveling from the condenser lens 14 toward the point B and shielded by the third light shielding member 20a. With this, the effective light source 24c has the inverted shape of the effective light source 24b.

By determining the positions of the first light shielding member 18a, the second light shielding member 18b, the third light shielding member 20a, and the fourth light shielding member 20b as described above, it is possible to match the first distance 18d with the second distance 20d shown in FIG. 2. Here, the first distance 18d is the distance between the surface including the optical axis 1b and orthogonal to the scanning direction and the midpoint 18c between the end portion 18aA of the first light shielding member 18a and the end portion 18bA of the second light shielding member 18b. The second distance 20d is the distance between the surface including the optical axis 1b and orthogonal to the scanning direction and the midpoint 20c between the end portion 20aA of the third light shielding member 20a and the end portion 20bA of the fourth light shielding member 20b.

With the arrangement as described above, there is always the point C for the given point B, that causes the effective light source 24c to have a shape obtained by inverting the shape of the effective light source 24b in the scanning direction. Therefore, as shown in FIG. 4c, for the integrated effective light source 24d obtained by integrating all the light fluxes passing on the straight line including the points A, B, and C, the centroid light beam thereof is almost parallel to the optical axis 1b.

In this embodiment, the first light shielding unit 18 and the second light shielding unit 20 are adjusted using the first moving unit FMU and the second moving unit SMU (adjustment unit), respectively, so as to match the first distance 18d with the second distance 20d. With this, in the arrangement in which the first light shielding unit 18 and the second light shielding unit 20 are arranged on the upstream side and the downstream side, respectively, of the conjugate plane 19a of the surface 24 to be illuminated, it is possible to prevent (reduce) a centroid deviation of the effective light source caused by light-shielding by the first light shielding unit 18 and the second light shielding unit 20. Accordingly, the exposure apparatus 100 with a small decrease in telecentric degree can be implemented.

Figure 5:
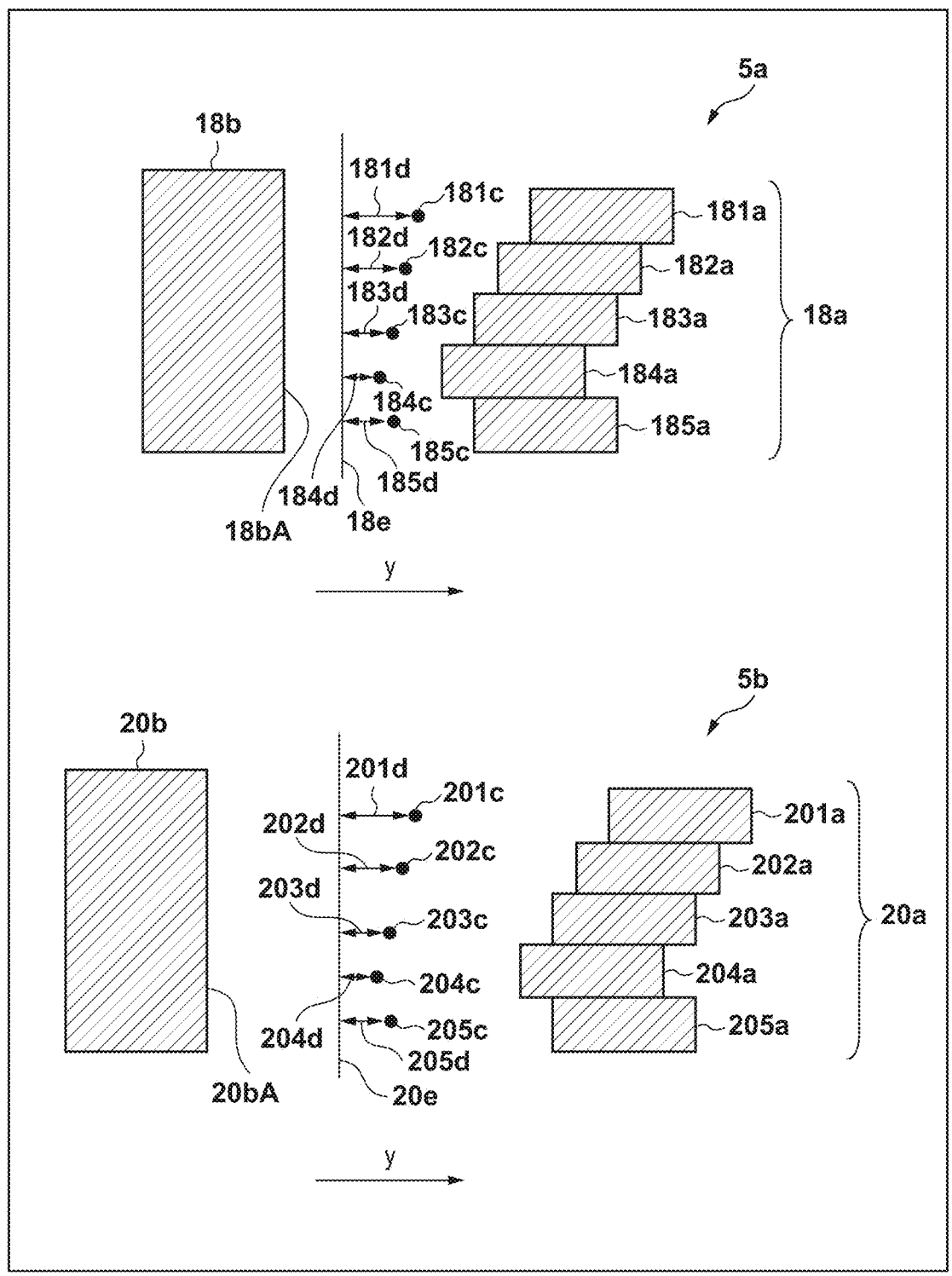
FIG. 5 is a view showing the first light shielding unit and a second light shielding unit each including a plurality of light shielding plates.

With reference to FIGS. 5a and 5b, a case will be described in which each of the first light shielding member 18a and the third light shielding member 20a includes a plurality of light shielding plates (partially light shielding members) arrayed along the direction orthogonal to the scanning direction in the plane of the conjugate plane 19a. FIG. 5a is a view showing the first light shielding unit 18 viewed from the upstream side in the optical axis direction, and FIG. 5b is a view showing the second light shielding unit 20 viewed from the upstream side in the optical axis direction. In FIGS. 5a and 5b, the y direction indicates the scanning direction.

In order to correct the unevenness of the illuminance distribution integrated in the scanning direction in the surface 24 to be illuminated, each of the first light shielding unit 18 and the second light shielding unit 20 needs to adjust the aperture width at the position (predetermined position) in the direction orthogonal to the scanning direction in the plane of the conjugate plane 19a. Therefore, the first light shielding member 18a includes five light shielding plates (first light shielding plates) 181a, 182a, 183a, 184a, and 185a arrayed along the direction orthogonal to the scanning direction in the plane of the conjugate plane 19a. The first moving unit FMU can independently move the light shielding plates 181a, 182a, 183a, 184a, and 185a in the scanning direction. Further, the third light shielding member 20a includes five light shielding plates (second light shielding plates) 201a, 202a, 203a, 204a, and 205a arrayed along the direction orthogonal to the scanning direction in the plane of the conjugate plane 19a. The second moving unit SMU can independently move the light shielding plates 201a, 202a, 203a, 204a, and 205a in the scanning direction.

Referring to FIG. 5a, a straight line 18e is a straight line passing through the optical axis 1b and orthogonal to the scanning direction. Midpoints 181c, 182c, 183c, 184c, and 185c are midpoints between the end portions of the light shielding plates 181a, 182a, 183a, 184a, and 185a on the second light shielding member side and the end portion 18bA of the second light shielding member 18b, respectively. Distances 181d, 182d, 183d, 184d, and 185d are distances between the midpoints 181c, 182c, 183c, 184c, and 185c and the straight line 18e, respectively.

Referring to FIG. 5b, a straight line 20e is a straight line passing through the optical axis 1b and orthogonal to the scanning direction. Midpoints 201c, 202c, 203c, 204c, and 205c are midpoints between the end portions of the light shielding plates 201a, 202a, 203a, 204a, and 205a on the fourth light shielding member side and the end portion 20bA of the fourth light shielding member 20b, respectively. Distances 201d, 202d, 203d, 204d, and 205d are distances between the midpoints 201c, 202c, 203c, 204c, and 205c and the straight line 20e, respectively.

In this embodiment, it is arranged such that, in the direction orthogonal to the scanning direction in the plane of the conjugate plane 19a, the centroid light beams passing through the positions of the light shielding plates 181a to 185a pass through the positions of the light shielding plates 201a to 205a, respectively. The positions of the light shielding plates 201a to 205a in the direction orthogonal to the scanning direction are determined to have the relationship as described above. For example, the positions are determined such that the positions of the light shielding plates 181a to 185a in the direction orthogonal to the scanning direction match the positions of the light shielding plates 201a to 205a in the direction orthogonal to the scanning direction, respectively. More specifically, the positions of the light shielding plates 201a to 205a are determined such that the distances 181d to 185d match the distances 201d to 205d, respectively. With this, at a given position orthogonal to the scanning direction in the plane of the conjugate plane 19a, the centroid light beam of the integrated effective light source is almost parallel to the optical axis 1b.

Figure 6:
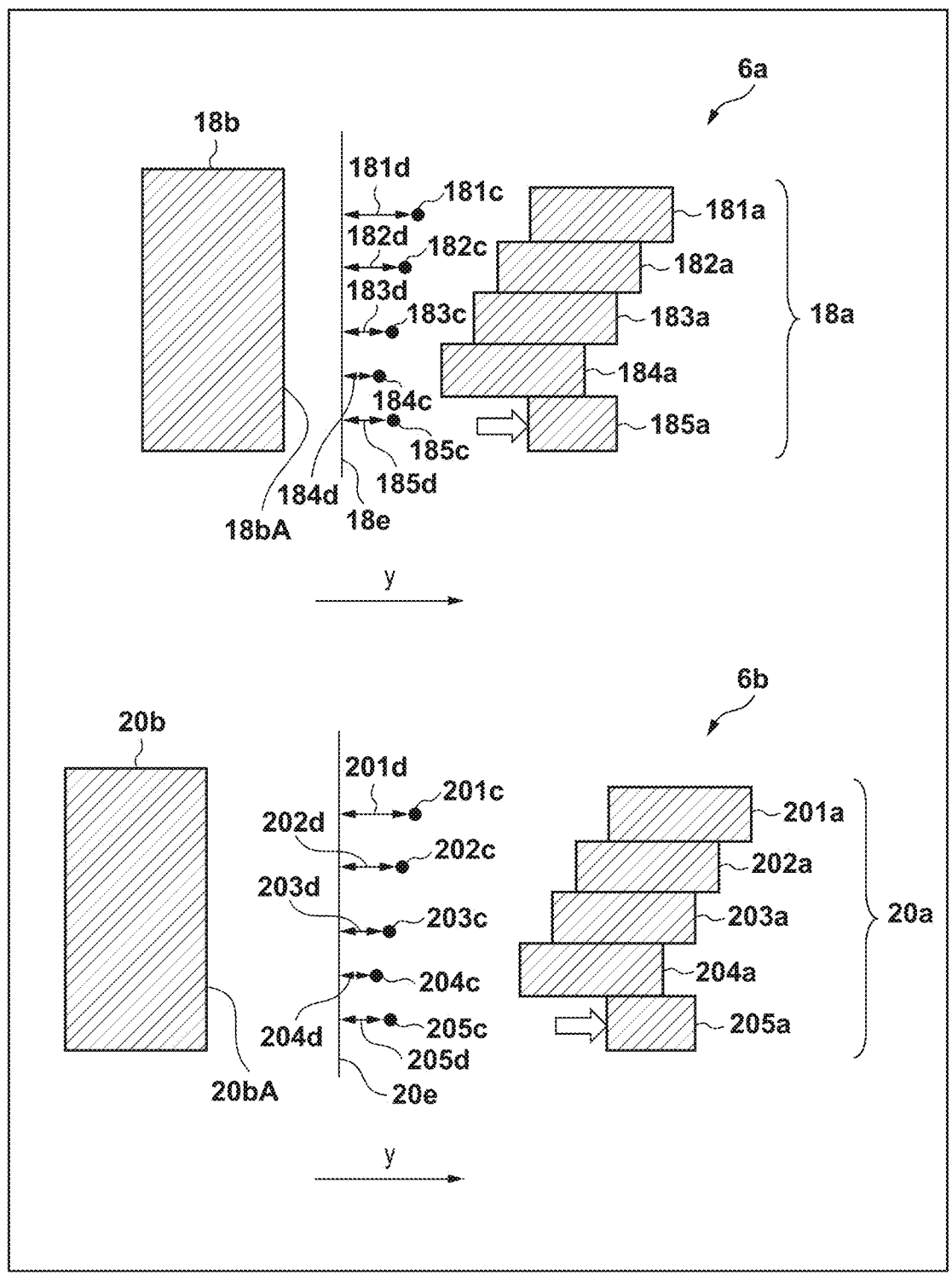
FIG. 6 is a view showing the first light shielding unit and the second light shielding unit each including the plurality of light shielding plates.

Next, with reference to FIGS. 6a and 6b, a case will be described in which, from the state shown in FIGS. 5a and 5b, the aperture width defined by the first light shielding unit 18 and the aperture width defined by the second light shielding unit 20 are changed using the first moving unit FMU and the second moving unit SMU. FIG. 6a is a view showing the first light shielding unit 18 viewed from the upstream side in the optical axis direction, and FIG. 6b is a view showing the second light shielding unit 20 viewed from the upstream side in the optical axis direction. In FIGS. 6a and 6b, the y direction indicates the scanning direction.

FIG. 6a shows a state in which the position of the light shielding plate 185a in the scanning direction has been changed by moving the light shielding plate 185a in the scanning direction in the first light shielding member 18a. FIG. 6b shows a state in which the position of the light shielding plate 205a in the scanning direction has been changed by moving the light shielding plate 205a in the scanning direction in the third light shielding member 20a in synchronization with the light shielding plate 185a of the first light shielding member 18a. Here, the amount of moving the light shielding plate 205a is equal to the amount of moving the light shielding plate 185a. In other words, the light shielding plate 185a and the light shielding plate 205a are moved in the same moving amount. Similarly, when moving the light shielding plates 181a to 184a in the scanning direction, the light shielding plates 201a to 204a are moved in the amount equal to the moving amount of the light shielding plates 181a to 184a in synchronization with the light shielding plates 181a to 184a. With this, it is possible to change the aperture width defined by the first light shielding unit 18 and the aperture width defined by the second light shielding unit 20 while maintaining the state in which the distances 181d to the 185d match (are equal to) the distances 201d to 205d, respectively. In other words, it is possible to change the aperture width defined by the first light shielding unit 18 and the aperture width defined by the second light shielding unit 20 while maintaining the state in which the centroid light beam of the integrated effective light source is almost parallel to the optical axis 1b at a given position orthogonal to the scanning direction in the plane of the conjugate plane 19a.

In this embodiment, the first light shielding unit 18 is arranged at a position away from the conjugate plane 19a of the surface 24 to be illuminated to the light source side, but the first light shielding unit 18 may be arranged at a position away from the surface 24 to be illuminated to the light source side. In this case, the distance 18d is set to a value obtained by dividing the distance between the surface including the optical axis 1b and orthogonal to the scanning direction and the midpoint 18c between the end portion 18aA of the first light shielding member 18a and the end portion 18bA of the second light shielding member 18b by the magnification (imaging magnification) between the conjugate plane 19a and the surface 24 to be illuminated.

A method of manufacturing an article according to the embodiment of the present invention is suitable for manufacturing an article such as a flat panel display, a liquid crystal display element, a semiconductor device, a MEMS or the like. This method of manufacturing includes a step of exposing a substrate coated with a photosensitive agent by using the above-described exposure apparatus 100 and a step of developing the exposed photosensitive agent. An etching step and an ion implantation step are performed on the substrate by using the pattern of the developed photosensitive agent as a mask, thereby forming a circuit pattern on the substrate. By repeating the steps such as these exposure, development, and etching steps, a circuit pattern formed from a plurality of layers is formed on the substrate. In a subsequent step, dicing (processing) is performed on the substrate on which the circuit pattern has been formed, and mounting, bonding, and inspection steps of a chip are performed. The method of manufacturing can further include other known steps (oxidation, deposition, vapor deposition, doping, planarization, resist removal, and the like). The method of manufacturing the article according to this embodiment is superior to the conventional method in at least one of the performance, quality, productivity, and production cost of the article.

According to the present invention, it is possible to provide, for example, an exposure apparatus advantageous in suppressing a shift of the centroid light beam of a light intensity distribution on a surface to be illuminated and a decrease in telecentric degree.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An exposure apparatus that exposes a substrate while moving an original and the substrate in a scanning direction, comprising
    an illumination optical system configured to illuminate a surface to be illuminated of the original with light from a light source,
    wherein the illumination optical system comprises
    a first light shielding unit including a first light shielding member and a second light shielding member, which include end portions facing each other in an equivalent direction equivalent to the scanning direction in a conjugate plane of the surface to be illuminated and in which a relative distance therebetween in the equivalent direction can be changed, and arranged at a position away from the conjugate plane to a side of the light source, and
    a second light shielding unit including a third light shielding member and a fourth light shielding member, which include end portions facing each other in the equivalent direction and in which a relative distance therebetween in the equivalent direction can be changed, and arranged at a position away from the conjugate plane to a side of the surface to be illuminated, and
    wherein the first light shielding unit and the second light shielding unit are arranged such that, at a predetermined position in a direction orthogonal to the equivalent direction in the conjugate plane, the end portion of the first light shielding member and the end portion of the third light shielding member exist at the same side with respect to a plane including an optical axis of the illumination optical system and orthogonal to the equivalent direction, distances from the plane to the end portion of the first light shielding member and to end portion of the third light shielding member are different from each other, a midpoint between the end portion of the first light shielding member and the end portion of the second light shielding member facing each other and a midpoint between the end portion of the third light shielding member and the end portion of the fourth light shielding member facing each other exist at the same side with respect to the plane and at positions away from the plane and a distance from the plane to the midpoint between the end portion of the first light shielding member and the end portion of the second light shielding member facing each other matches a distance from the plane to the midpoint between the end portion of the third light shielding member and the end portion of the fourth light shielding member facing each other.

2. The exposure apparatus according to claim 1, further comprising an adjustment unit configured to adjust the positions of the first light shielding unit and the second light shielding unit.

3. The exposure apparatus according to claim 2, wherein the adjustment unit includes
a first moving unit configured to move one of the first light shielding member and the second light shielding member along the equivalent direction, and
a second moving unit configured to move one of the third light shielding member and the fourth light shielding member along the equivalent direction, and
positions, in the equivalent direction, of the other one of the first light shielding member and the second light shielding member and the other one of the third light shielding member and the fourth light shielding member are fixed.

4. The exposure apparatus according to claim 2, wherein the adjustment unit moves at least one of the first light shielding member and the second light shielding member and at least one of the third light shielding member and the fourth light shielding member along the equivalent direction in synchronization with each other such that the first distance matches the second distance.

5. The exposure apparatus according to claim 2, wherein the adjustment unit moves at least one of the first light shielding member and the second light shielding member and at least one of the third light shielding member and the fourth light shielding member along the equivalent direction in the same moving amount.

6. The exposure apparatus according to claim 2, wherein
one of the first light shielding member and the second light shielding member includes a plurality of first light shielding plates arrayed along a direction orthogonal to the equivalent direction in the plane of the conjugate plane,
one of the third light shielding member and the fourth light shielding member includes a plurality of second light shielding plates arrayed along the direction orthogonal to the equivalent direction in the plane of the conjugate plane, and
the adjustment unit
independently moves the plurality of first light shielding plates along the equivalent direction, and
independently moves the plurality of second light shielding plates along the equivalent direction.

7. A manufacturing method of an article, comprising:
exposing a substrate using an exposure apparatus defined in claim 1;
developing the exposed substrate; and
manufacturing the article from the developed substrate.

8. The exposure apparatus according to claim 1, wherein a distance between the first light shielding unit and the conjugate plane is different from a distance between the second light shielding unit and the conjugate plane in a direction of the optical axis.

9. An exposure apparatus that exposes a substrate while moving an original and the substrate in a scanning direction, comprising
an illumination optical system configured to illuminate a surface to be illuminated of the original with light from a light source,
wherein the illumination optical system comprises
a first light shielding unit including a first light shielding member and a second light shielding member, which include end portions facing each other in an equivalent direction equivalent to the scanning direction in a conjugate plane of the surface to be illuminated and in which a relative distance therebetween in the equivalent direction can be changed, and arranged at a position away from the conjugate plane to a side of the light source, and
a second light shielding unit including a third light shielding member and a fourth light shielding member, which include end portions facing each other in the equivalent direction and in which a relative distance therebetween in the equivalent direction can be changed, and arranged at a position away from a conjugate plane of the surface to be illuminated to a side of the surface to be illuminated, and
wherein the first light shielding unit and the second light shielding unit are arranged such that, at a predetermined position in a direction orthogonal to the scanning direction in the conjugate plane, the end portion of the first light shielding member and the end portion of the third light shielding member exist at the same side with respect to a plane including an optical axis of the illumination optical system and orthogonal to the equivalent direction, distances from the plane to the end portion of the first light shielding member and to end portion of the third light shielding member are different from each other, and a midpoint between the end portion of the first light shielding member and the end portion of the second light shielding member facing each other a midpoint between the end portion of the third light shielding member and the end portion of the fourth light shielding member facing each other exist at the same side with respect to the plane and at positions away from the plane, a value obtained by dividing a distance between a midpoint between the end portion of the first light shielding member and the end portion of the second light shielding member facing each other and the plane by a magnification between the conjugate plane and the surface to be luminated matches a distance between a midpoint between the end portion of the third light shielding member and the end portion of the fourth light shielding member facing each other and the plane.

10. A manufacturing method of an article, comprising:
exposing a substrate using an exposure apparatus defined in claim 9;
developing the exposed substrate; and
manufacturing the article from the developed substrate.

11. An exposure apparatus that exposes a substrate while moving an original and the substrate in a scanning direction, comprising
an illumination optical system configured to illuminate a surface to be illuminated of the original with light from a light source,
wherein the illumination optical system comprises
a first light shielding unit including a first light shielding member and a second light shielding member, which include end portions facing each other in an equivalent direction equivalent to the scanning direction in a conjugate plane of the surface to be illuminated and in which a relative distance therebetween in the equivalent direction can be changed, and arranged at a position away from the conjugate plane to a side of the light source, and
a second light shielding unit including a third light shielding member and a fourth light shielding member, which include end portions facing each other in the equivalent direction and in which a relative distance therebetween in the equivalent direction can be changed, and arranged at a position away from the conjugate plane to a side of the surface to be illuminated, and
wherein the first light shielding unit and the second light shielding unit are arranged such that, at a predetermined position in a direction orthogonal to the equivalent direction in the conjugate plane, the end portion of the first light shielding member and the end portion of the third light shielding member exist at the same side with respect to a plane including an optical axis of the illumination optical system and orthogonal to the equivalent direction, distances from the plane to the end portion of the first light shielding member and to end portion of the third light shielding member are different from each other, and a midpoint between the end portion of the first light shielding member and the end portion of the second light shielding member facing each other and a midpoint between the end portion of the third light shielding member and the end portion of the fourth light shielding member facing each other exit at the same side with respect to the plane and at positions away from the plane.

12. A manufacturing method of an article, comprising:
exposing a substrate using an exposure apparatus defined in claim 11;
developing the exposed substrate; and
manufacturing the article from the developed substrate.

13. The exposure apparatus according to claim 11, wherein a distance between the first light shielding unit and the conjugate plane is different from a distance between the second light shielding unit and the conjugate plane in a direction of the optical axis.

14. The exposure apparatus according to claim 11, further comprising an adjustment unit configured to adjust the positions of the first light shielding unit and the second light shielding unit.

15. The exposure apparatus according to claim 14, wherein
the adjustment unit includes
a first moving unit configured to move one of the first light shielding member and the second light shielding member along the equivalent direction, and
a second moving unit configured to move one of the third light shielding member and the fourth light shielding member along the equivalent direction, and
positions, in the equivalent direction, of the other one of the first light shielding member and the second light shielding member and the other one of the third light shielding member and the fourth light shielding member are fixed.

16. The exposure apparatus according to claim 14, wherein the adjustment unit moves at least one of the first light shielding member and the second light shielding member and at least one of the third light shielding member and the fourth light shielding member along the equivalent direction in synchronization with each other such that the first distance matches the second distance.

17. The exposure apparatus according to claim 14, wherein the adjustment unit moves at least one of the first light shielding member and the second light shielding member and at least one of the third light shielding member and the fourth light shielding member along the equivalent direction in the same moving amount.

18. The exposure apparatus according to claim 14, wherein
one of the first light shielding member and the second light shielding member includes a plurality of first light shielding plates arrayed along a direction orthogonal to the equivalent direction in the plane of the conjugate plane,
one of the third light shielding member and the fourth light shielding member includes a plurality of second light shielding plates arrayed along the direction orthogonal to the equivalent direction in the plane of the conjugate plane, and
the adjustment unit
independently moves the plurality of first light shielding plates along the equivalent direction, and
independently moves the plurality of second light shielding plates along the equivalent direction.

* * * * *